United States Patent

Stubbe et al.

[11] Patent Number: 5,614,864
[45] Date of Patent: Mar. 25, 1997

[54] SINGLE-ENDED TO DIFFERENTIAL CONVERTER WITH RELAXED COMMON-MODE INPUT REQUIREMENTS

[75] Inventors: Frederic M. Stubbe, Irvine; Daryush Shamlou, Laguna Niguel; Kashif A. Ahmed; Guangming Yin, both of Irvine, all of Calif.

[73] Assignee: Rockwell Science Center, Inc., Newport Beach, Calif.

[21] Appl. No.: 536,405

[22] Filed: Sep. 29, 1995

[51] Int. Cl.$^6$ ........................................ H03F 3/45
[52] U.S. Cl. .................. 330/69; 330/258; 330/260; 330/301
[58] Field of Search ........................ 330/69, 108, 258, 330/260, 275, 301

[56] References Cited

PUBLICATIONS

Frank et al., "Inexpensive Analogue Amplifier For Mechanical Recording", *Medical & Biological Engineering & Computing*, Jan. 1978, p. 118–120.
Godden, "Amplify Biological Signals With ICs", *Electronic Design* 17, Aug. 16, 1969, pp. 218–224.

*Primary Examiner*—James B. Mullins
*Attorney, Agent, or Firm*—H. Fredrick Hamann; George A. Montanye; Philip K. Yu

[57] ABSTRACT

A converter for converting a single-ended input $V_{IN}$ to a differential output signal $V_{OUT}$ through positive and negative output terminals is disclosed. The converter comprises a fully differential amplifier with one of its input terminals coupled to the single-ended input and its other input terminal coupled to a fixed voltage. The converter also has a first resistor ("$R_1$") coupled between the single-ended input and the positive input terminal of the fully differential amplifier, a second resistor ("$R_2$") coupled between the fixed voltage and the negative input terminal of the fully differential amplifier, a third resistor ("$R_3$") coupled between the positive input terminal and the negative output terminal of the fully differential amplifier, and a fourth resistor ("$R_4$") coupled between the negative input terminal and the positive output terminal, wherein the values of such resistors are governed by:

$$\frac{R_3}{R_1} \neq \frac{R_4}{R_2}.$$

The same principles can be applied to differential-to-single-ended converters as well.

8 Claims, 2 Drawing Sheets

SINGLE-ENDED TO DIFFERENTIAL CONVERTER WITH RELAXED COMMON-MODE INPUT REQUIREMENTS

FIELD OF THE INVENTION

The present invention relates to differential amplifier circuits and more particularly to single-ended-to-differential and differential-to-single-ended converters.

ART BACKGROUND

A typical operational amplifier is shown in FIG. 1. As will be readily appreciated by those skilled in the art, the relationship between the output signal and the input signal is commonly expressed as:

$$\frac{V_{out}}{V_{in}} = \frac{-R_3}{R_1}.$$

Note that the positive input to the amplifier is tied to analog ground ("AGND"), which is typically half way between positive and negative supply rails. The amplification is thus dictated by the resistance ratio of $R_3$ to $R_1$.

For high dynamic range applications, differential circuits such as the one symbolically shown in FIG. 2 are desired. The need for differential circuits is simple: For an input voltage with peak-to-peak voltage of 2 v, the outputs, INP and INM, will produce a differential output range from +2 v to −2 v, which doubles the effective dynamic range of the input signal without having to increase the supply voltage of the amplifier. This higher dynamic range of an amplifier is quite desirable in low-power audio or speech processing circuits.

FIG. 3 shows a circuit diagram of a typical differential amplifier with differential inputs, INM and INP, and differential outputs, OUTP and OUTM. The gain of this circuit is commonly expressed by:

$$\frac{OUTP - OUTM}{INP - INM} = \frac{+R_3}{R_1}.$$

Note that the common-mode input voltage, $V_{CM}(=(V_A+V_B)/2)$ is fixed, and independent of the differential input in the case of fully differential amplifiers, as commonly known to those skilled in the art.

A conventional single-ended to differential amplifier is shown in FIG. 4, which originates from the combination of FIGS. 2 and 3. Note that the input to the amplifier at the positive terminal is now connected to AGND. The gain of this amplifier of FIG. 4 is still:

$$\frac{(OUTP - OUTM)}{IN} = \frac{+R_3}{R_1},$$

since IN is relative to AGND.

However, the common-mode input voltage $V_{CM}$, i.e. $(V_A+V_B)/2$, is now changing with the input voltage, IN, in the following way:

$$V_{CM} = \frac{R_1}{R_1 + R_3} \cdot OUTP$$

Thus, if IN decreases, $V_{CM}$ also decreases due to its relation to OUTP and vice versa. To put it in practical terms, the common-mode input voltage of the differential amplifier of FIG. 4 will change according to the input signal, in contrast to the differential input-independence of the fully differential amplifier of FIG. 3.

This dependence requires a large common-mode input range for the single-ended to differential amplifier, especially in the cases of applications with a low supply voltage such as 2.7 v. A large common-mode input voltage forces the transistors used for the tail current of the differential pair to operate in the linear region, instead of the strong inversion region. Therefore, conventional single-ended to differential amplifiers require complementary input stages to deal with the large common-mode input signals to the amplifier, resulting in extra power and more components.

For high dynamic range applications, it is desirable to have a single-ended to differential amplifier with low common-mode input requirement without incurring extra power consumption or increasing component complexity.

SUMMARY OF THE INVENTION

An improved single-ended to differential converter with relaxed common-mode input requirements is disclosed. By changing the resistor ratios on the input and feedback resistors in a precise manner, the input common-mode ratio can be lowered to any value needed. In particular, the common-mode input voltage is lowered by making the ratio of the feedback resistor to the input resistor connected to a fixed voltage (e.g. AGND) much larger than the corresponding ratio of the resistors connected to the input signal.

In accordance with the present invention, a converter for converting a single-ended input $V_{IN}$ to a differential output signal $V_{OUT}$ through positive and negative output terminals is disclosed. The converter comprises a fully differential amplifier with one of its input terminals coupled to the single-ended input and its other input terminal coupled to a fixed voltage (e.g. AGND). The converter also has a first resistor ("$R_1$") coupled between the single-ended input and the positive input terminal of the fully differential amplifier, a second resistor ("$R_2$") coupled between the fixed voltage (e.g. AGND) and the negative input terminal of the fully differential amplifier, a third resistor ("$R_3$") coupled between the positive input terminal and the negative output terminal of the fully differential amplifier, and a fourth resistor ("$R_4$") coupled between the negative input terminal and the positive output terminal, wherein the values of such resistors are governed by:

$$\frac{R_3}{R_1} \neq \frac{R_4}{R_2}.$$

The same principles can be applied to differential-to-single-ended converters as well.

BRIEF DESCRIPTION OF THE DRAWINGS

Additional objects, features and advantages of the present invention will become apparent to those skilled in the art from the following detailed description, wherein.

DETAILED DESCRIPTION OF THE PREFERRED EMBODIMENT

Figure 5:
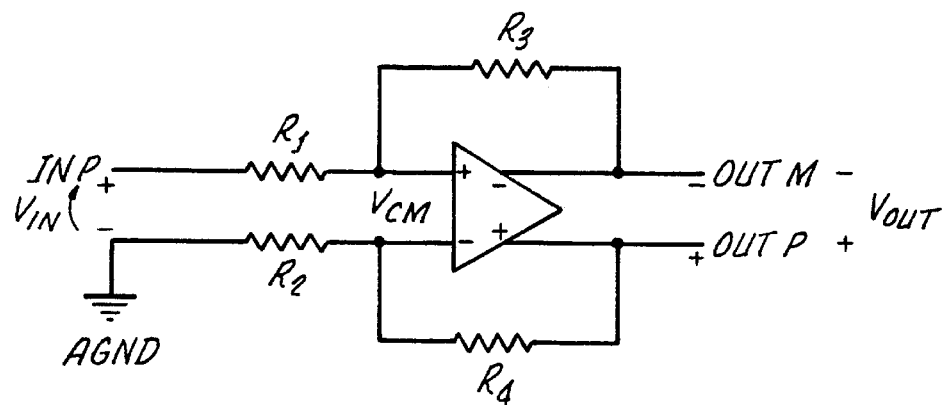
FIG. 5 illustrates a single-ended to differential amplifier in accordance with the present invention.

Reference is made to FIG. 5, where a circuit diagram of a single-ended to differential amplifier in accordance with the present invention is shown. The input resistor is designated as $R_1$ and a feedback resistor $R_3$ is coupled between the output OUTM and the positive terminal of the amplifier. Another feedback resistor $R_4$ is coupled between the output OUTP and the negative terminal of the amplifier, while the input resistor $R_2$ is coupled between the negative terminal and AGND.

Figure 1:
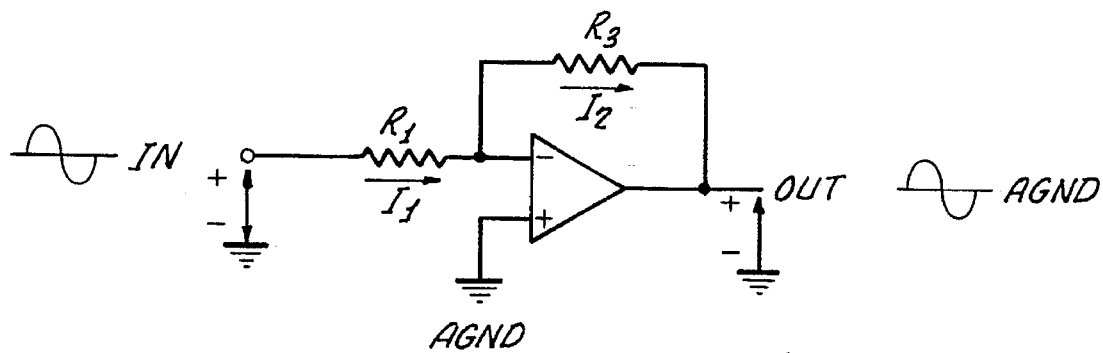
FIG. 1 illustrates a conventional amplifier.
Figure 2:
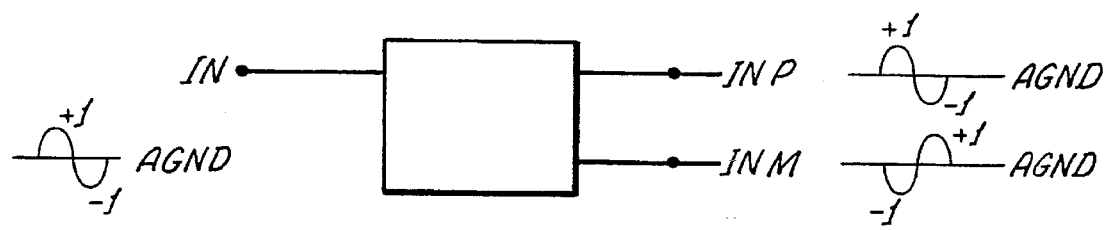
FIG. 2 illustrates a symbolic single-ended to differential amplifier.
Figure 3:
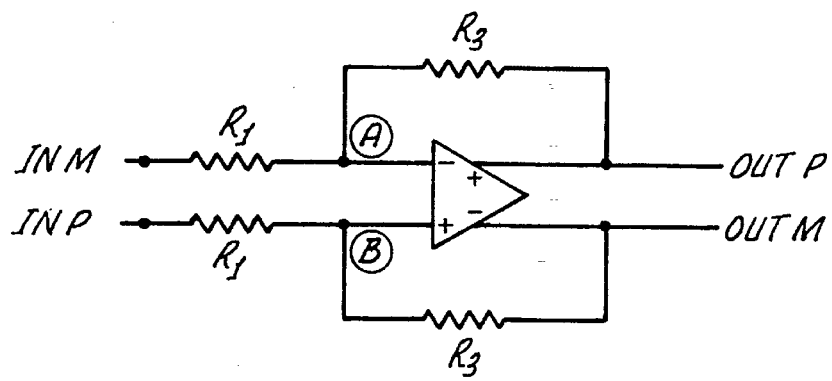
FIG. 3 illustrates a conventional fully differential amplifier.
Figure 4:
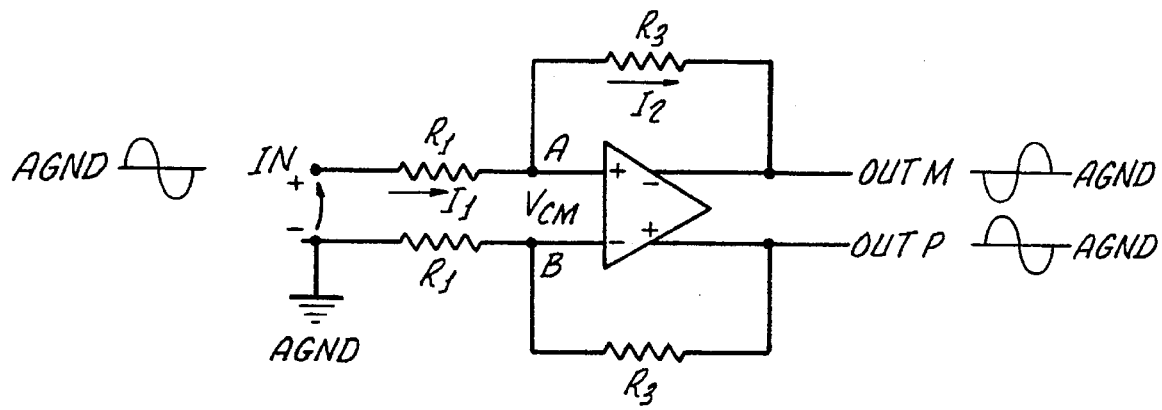
FIG. 4 illustrates a conventional approach to a single-ended to differential amplifier.

To address the problem of common-mode input requirements in the conventional single-ended to differential amplifier, the resistors $R_1$, $R_2$, $R_3$ and $R_4$ are set such that their conventional symmetry as in FIG. 4 is removed:

$$\frac{R_3}{R_1} \neq \frac{R_4}{R_2}.$$

Further, to alleviate the common-mode input requirement of the single-ended to differential amplifier, the values of the resistors $R_1$, $R_2$, $R_3$ and $R_4$ can be adjusted according to the following coupled relationships: (assuming the amplifier has infinite gain)

$$(1) \quad \text{GAIN} = \frac{V_{OUT}}{V_{IN}} = \frac{2R_3}{R_1 + R_2 \frac{(R_1 + R_3)}{(R_2 + R_4)}}, \quad \text{(Equation 1)}$$

where $V_{OUT}$=OUTP−OUTM, and $V_{IN}$=INP−AGND, and $$(2) \quad \frac{V_{CM}}{V_{IN}} = \frac{R_3}{R_1 + R_2 \frac{(R_1 + R_3)}{(R_2 + R_4)}} \cdot \frac{R_2}{(R_2 + R_4)}, \quad \text{(Equation 2)}$$

where $V_{CM}$ is the common-mode voltage at the input of the amplifier. With Equations 1 and 2 in mind, the goal therefore becomes one of minimizing Equation 2 while preserving a desired gain according to Equation 1.

For example, for a conventional amplifier, $R_3$ is twice $R_1$ and $R_4$ is twice $R_2$, i.e.

$$\frac{R_3}{R_1} = \frac{R_4}{R_2}.$$

This heretofore required symmetry, however, has rendered the conventional single-ended to differential amplifier more complicated, if not completely inoperational for low supply voltage applications, due to the increased common-mode input requirement. To alleviate the common-mode input requirement, i.e. $V_{CM}/V_{IN}$ ratio, the ratio $R_3/R_1$ needs to be made much greater than $R_4/R_2$, as can be seen by Equation 2. Also, to satisfy Equation 1, $R_3$ is made almost the same as $R_1$ to compensate for the gain as the result of a large $R_4/R_2$.

Figure 6:
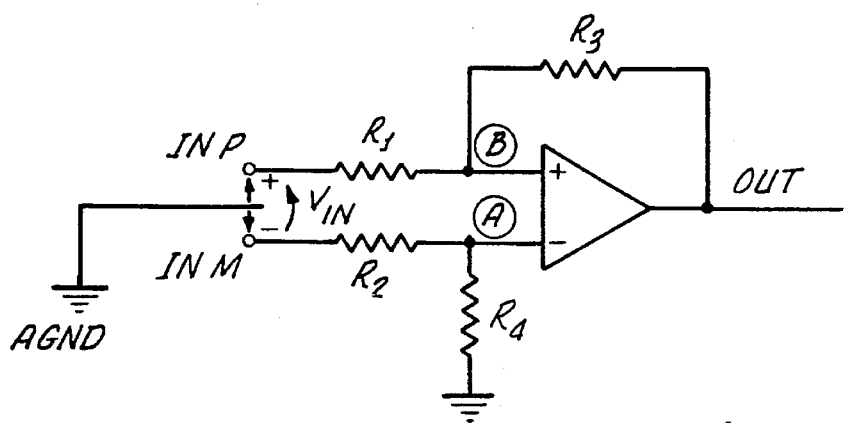
FIG. 6 illustrates a differential to single-ended converter also in accordance with the present invention.

As will be appreciated by those skilled in the art, the same principles of relaxing common-mode input requirements for single-ended to different converters can be applied to a differential-to-single- ended converter as shown in FIG. 6.

In FIG. 6, a differential input signal $V_{IN}$ has its positive terminal INP connected to the positive terminal of the amplifier through an input resistor $R_1$, and its negative terminal, INM, connected to the negative terminal of the amplifier through an input resistor $R_2$. A feedback resistor $R_3$ is coupled between the output terminal and the positive terminal at node B. Another resistor $R_4$ is coupled between the negative terminal and a fixed voltage (e.g. AGND).

In this case, the resistors $R_1$, $R_2$, $R_3$ and $R_4$ are governed according to the following equations:

$$\frac{V_{CM}}{V_{IN}} = \frac{-1}{2} \cdot \frac{R_4}{R_2 + R_4} \quad \text{(Equation 3)}$$

$$\frac{V_{OUT}}{V_{IN}} = -\frac{1}{2} \cdot \frac{R_4 R_1 + R_3(R_2 + R_4) + R_3 R_4}{R_1(R_2 + R_4)}, \quad \text{(Equation 4)}$$

if $INM = -INP$

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims. In the claims, means-plus-function clauses are intended to cover the structures described herein as performing the recited function and not only structural equivalents but also equivalent structures. Thus although a nail and a screw may not be structural equivalents in that a nail employs a cylindrical surface to secure wooden parts together, whereas a screw employs a helical surface, in the environment of fastening wooden parts, a nail and a screw may be equivalent structures.

We claim:

1. A converter for converting a single-ended input $V_{IN}$ to a differential output signal $V_{OUT}$ through positive and negative output terminals, comprising:

a fully differential amplifier having a positive input terminal coupled to said single-ended input and a negative input terminal coupled to a predetermined fixed voltage, said fully differential amplifier having a predetermined common-mode voltage $V_{CM}$;

first resistor means ("$R_1$") coupled between said single-ended input and said positive input terminal of said fully differential amplifier;

second resistor means ("$R_2$") coupled between said predetermined fixed voltage and said negative input terminal of said fully differential amplifier;

third resistor means ("$R_3$") coupled between said positive input terminal and said negative output terminal of said fully differential amplifier;

fourth resistor means ("$R_4$") coupled between said negative input terminal and said positive output terminal, wherein said R1, R2, R3 and R4 are implemented such that a ratio of resistance of $R_3$ to $R_1$ is set not equal to a ratio of resistance of $R_4$ to $R_2$, such that a ratio of voltages of $V_{CM}$ to $V_{IN}$ is reduced for said fully differential amplifier.

2. A converter according to claim 1, wherein said converter has a gain ratio of said single-ended input $V_{IN}$ to said differential output $V_{OUT}$ given by:

$$\frac{V_{OUT}}{V_{IN}} = \frac{2R_3}{R_1 + R_2 \frac{(R_1 + R_3)}{(R_2 + R_4)}},$$

and said converter also has a voltage transfer function of said single-ended input $V_{IN}$ to said predetermined common-mode voltage $V_{CM}$ given by:

$$\frac{V_{CM}}{V_{IN}} = \frac{R_3}{R_1 + R_2 \frac{(R_1 + R_3)}{(R_2 + R_4)}} \cdot \frac{R_2}{(R_2 + R_4)}.$$

3. A converter according to claim 1, wherein said predetermined fixed voltage is at half way between a positive supply voltage source and a negative supply voltage source.

4. A method of generating a differential output signal $V_{OUT}$ by a single-ended input $V_{IN}$, comprising the steps of:

(a) applying said single-ended input $V_{IN}$ to a fully differential amplifier having a positive input terminals coupled to said single-ended input $V_{IN}$ and a negative input terminal coupled to a predetermined fixed voltage, said fully differential amplifier having a predetermined common-mode voltage $V_{CM}$;

(b) coupling a first resistor ("$R_1$") between said single-ended input and said positive input terminal of said fully differential amplifier;

(c) coupling a second resistor ("$R_2$") between said predetermined fixed voltage and said negative input terminal of said fully differential amplifier;

(d) coupling a third resistor ("$R_3$") between said positive input terminal and a negative output terminal of said fully differential amplifier;

(d) coupling a fourth resistor ("$R_4$") between said negative input terminal and a positive output terminal, (e) setting values of said $R_1$, $R_2$, $R_3$, and $R_4$ such that their values are in accordance with $$\frac{R_3}{R_1} \neq \frac{R_4}{R_2}.$$

5. A converter according to claim 4, further comprising:

(f) adjusting values of said $R_1$, $R_2$, $R_3$, and $R_4$ of said converter based on a gain ratio of said single-ended input $V_{IN}$ to said differential output $V_{OUT}$ given by:

$$\frac{R_3}{R_1} \neq \frac{R_4}{R_2}.$$

and based on a voltage transfer function of said single-ended input $V_{IN}$ to said predetermined common-mode voltage $V_{CM}$ given by:

$$\frac{V_{CM}}{V_{IN}} = \frac{R_3}{R_1 + R_2 \frac{(R_1 + R_3)}{(R_2 + R_4)}} \cdot \frac{R_2}{(R_2 + R_4)}.$$

6. A converter according to claim 4, wherein said predetermined fixed voltage is at half way between a positive supply voltage source and a negative supply voltage source.

7. A converter for convening a differential input voltage $V_{IN}$, wherein $V_{IN}$=INP–INM, to a single-ended output voltage $V_{OUT}$ through positive and negative input terminals, comprising:

a fully differential amplifier having said positive input terminal coupled to the positive input INP and said negative input terminal coupled to the negative input INM, said fully differential amplifier having a predetermined common-mode voltage $V_{CM}$;

first resistor means ("$R_1$") coupled between said INP and said positive input terminal of said fully differential amplifier;

second resistor means ("$R_2$") coupled between said INM and said negative input terminal of said fully differential amplifier;

third resistor means ("$R_3$") coupled between said positive input terminal and an output terminal of said fully differential amplifier;

fourth resistor means ("$R_4$") coupled between said negative input terminal and a fixed voltage, wherein said R1, R2, R3 and R4 are implemented such that a ratio of resistance of $R_3$ to $R_1$ is set not equal to a ratio of resistance of $R_4$ to $R_2$, such that a ratio of voltages of $V_{CM}$ to $V_{IN}$ is reduced for said fully differential amplifier.

8. A converter according to claim 7, wherein said converter has a gain ratio of said differential input voltage $V_{IN}$ to said output voltage $V_{OUT}$ given by:

$$\frac{V_{OUT}}{V_{IN}} = -\frac{1}{2} \cdot \frac{R_4 R_1 + R_3(R_2 + R_4) + R_3 R_4}{R_1(R_2 + R_4)},$$

and said converter also has a voltage transfer function of said differential input $V_{IN}$ to said predetermined common-mode voltage $V_{CM}$ given by:

$$\frac{V_{CM}}{V_{IN}} = \frac{-1}{2} \cdot \frac{R_4}{R_2 + R_4}.$$

* * * * *